United States Patent
Agnello et al.

(12)
(10) Patent No.: US 6,335,294 B1
(45) Date of Patent: Jan. 1, 2002

(54) WET CLEANS FOR COBALT DISILICIDE PROCESSING

(75) Inventors: David Paul Agnello, Wappingers Falls, NY (US); Mary Conroy Bushey, South Burlington, VT (US); Donna K. Johnson, Underhill, VT (US); Jerome Brett Lasky, Essex Junction, VT (US); Peter James Lindgren, Burlington, VT (US); Kirk David Peterson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/296,338

(22) Filed: Apr. 22, 1999

(51) Int. Cl.⁷ ............................................. H01L 21/00
(52) U.S. Cl. ............................ 438/755; 134/2; 134/29; 134/39; 216/99; 438/664; 438/749
(58) Field of Search ................................. 438/664, 745, 438/749, 751, 755; 216/99; 134/1.3, 2, 29, 39

(56) References Cited

U.S. PATENT DOCUMENTS

| | | |
|---|---|---|
| 5,344,793 A | 9/1994 | Zeininger et al. |
| 5,449,642 A | 9/1995 | Tan et al. |
| 5,462,891 A | 10/1995 | Okada |
| 5,541,455 A | 7/1996 | Hodges |
| 5,672,901 A | 9/1997 | Abernathey et al. |
| 5,723,893 A | 3/1998 | Yu et al. |
| 5,776,822 A * | 7/1998 | Fujii et al. .............. 438/755 X |
| 5,780,929 A | 7/1998 | Zeininger et al. |
| 5,933,757 A * | 8/1999 | Yoshikawa et al. ..... 438/755 X |

OTHER PUBLICATIONS

Barmak et al., Separation of Gate Salicidaton from the Source/Drain Salicidation, "IBM Technical Disclosure Bulletin, " vol. 34, No. 10A, pp. 474–477, Mar. 1992.

* cited by examiner

Primary Examiner—William A. Powell
(74) Attorney, Agent, or Firm—Schmeiser, Olsen & Watts; William D. Sabo

(57) ABSTRACT

A method for removing a formation of oxide of titanium that is generated as a byproduct of a process that forms cobalt disilicide within an insulated-gate field effect transistor (FET). The method applies a chemical reagent to the FET at a predetermined temperature, and for a predetermined period of time, necessary for removing the formation, wherein the reagent does not chemically react with the cobalt disilicide. A reagent that accomplishes this task comprises water ($H_2O$), ammonium hydroxide ($NH_4OH$), and hydrogen peroxide ($H_2O_2$), wherein the $NH_4OH$ and the $H_2O_2$ each comprise approximately 4% of the total reagent volume. An effective temperature is 65° C. combined with a 3 minute period of application.

24 Claims, 7 Drawing Sheets

US 6,335,294 B1

WET CLEANS FOR COBALT DISILICIDE PROCESSING

BACKGROUND OF THE INVENTION

1. Technical Field

The present invention relates to a method for removing a formation of an oxide of titanium that is generated as a byproduct of a process that forms cobalt disilicide within an insulated-gate field effect transistor.

2. Related Art

Integrated circuits constructed on silicon substrates are limited in performance by the resistance of the source, drain, and gate of a field effect transistor (FET). This difficulty may be addressed by forming cobalt disilicide areas within FETs, since the cobalt disilicide areas have low electrical resistance. For example, cobalt disilicide within the source and drain of an FET lowers the total resistance for current flow from a contact, through the FET source, into the FET channel, and out of the FET drain.

In the formation of cobalt disilicide, it is well known to utilize a layer of cobalt as a source for the cobalt disilicide and to use a titanium nitride (TiN) capping layer to protect the cobalt from oxidizing during a subsequent annealing step. After a first annealing step, this sacrificial TiN capping layer is chemically removed by a selective etch with a solution such as one comprising hydrogen peroxide. Discrete portions of the TiN cap are not always removed by this process, however, and a residual configuration, or "stringer," of one or more oxides of titanium, such as titanium dioxide, may remain after the cobalt disilicide is formed in a second annealing, step. Unfortunately, the stringer of a titanium oxide is electrically conductive and may cause electrical shorting of adjacent structures. For example, the stringer may cause a short between the gate and the drain of an FET, between the source of a first FET and the drain of a second FET, or between the drain of an FET and external circuitry. The prior art does not disclose a method of removing a stringer of an oxide of titanium that is generated as described above.

SUMMARY OF THE INVENTION

The present invention provides a method of removing an oxide of titanium which is generated as a byproduct of a process that forms cobalt disilicide within a semiconductor device such as an FET.

The present invention provides an FET within a substrate, wherein the FET is a gate-insulated field effect transistor comprising a source, a drain, a gate, a gate insulator, and a channel. Typically, the substrate is first precleaned with a suitable reagent such as hydrofluoric acid (HF). This precleaning removes a film of silicon dioxide ($SiO_2$) that became deposited on a surface of the layer of silicon as a consequence of prior processing or of prior exposure of the substrate to air at room temperature. Next, a layer of cobalt is formed on a top surface of the substrate by use of a sputtering process such as with argon gas in a low-pressure chamber. The top surface of the substrate comprises a portion of the top surface of each of the source, drain, gate, and insulating structures. Next, a layer of titanium nitride is formed on the layer of cobalt by use of a second sputtering process such as with argon gas and nitrogen gas in a low-pressure chamber. Then a first annealing of the substrate causes portions of the layer of cobalt to react with the source, drain, and gate to transform a top portion of each of the source, drain, and gate into a silicide zone comprising a greater amount of cobalt silicide (CoSi) and a lesser amount of cobalt disilicide ($CoSi_2$). Unreacted cobalt remains after the preceding annealing step, particularly on top of the isolating structures. The layer of titanium nitride and the unreacted cobalt are removed by a first cleaning with a reagent such as one comprising hydrogen peroxide and sulfuric acid. Impurities comprising titanium, cobalt, silicon, oxygen, and/or nitrogen may be present on the substrate after the first cleaning and a second cleaning is performed to remove the impurities. The first and second cleanings in combination may not successfully remove all impurities and impurities comprising titanium may be present on the substrate. Next, a second annealing process transforms cobalt monosilicide to cobalt disilicide in the silicide zone, thereby forming the desired cobalt disilicide within the FET. Nonetheless, a stringer of an oxide of titanium may be present on one or more of the cobalt disilicide areas of the silicide zone following the second annealing, and all such stringers should be removed to prevent shorting of adjacent electrical structures of, within, or coupled to, the FET. The final step removes the stringers by applying a reagent to the substrate at a suitable temperature, and for a period of time, wherein the reagent does not chemically react with the cobalt disilicide.

Use of an FET in the preceding method is illustrative. The preceding process steps may be applied to any semiconductor structure to form cobalt disilicide volumes that are free of stringers of an oxide of titanium.

Thus, the invention has the advantage of forming cobalt disilicide by a process that does not leave stringers of one or more oxides of titanium.

DETAILED DESCRIPTION OF THE INVENTION

Figure 1:
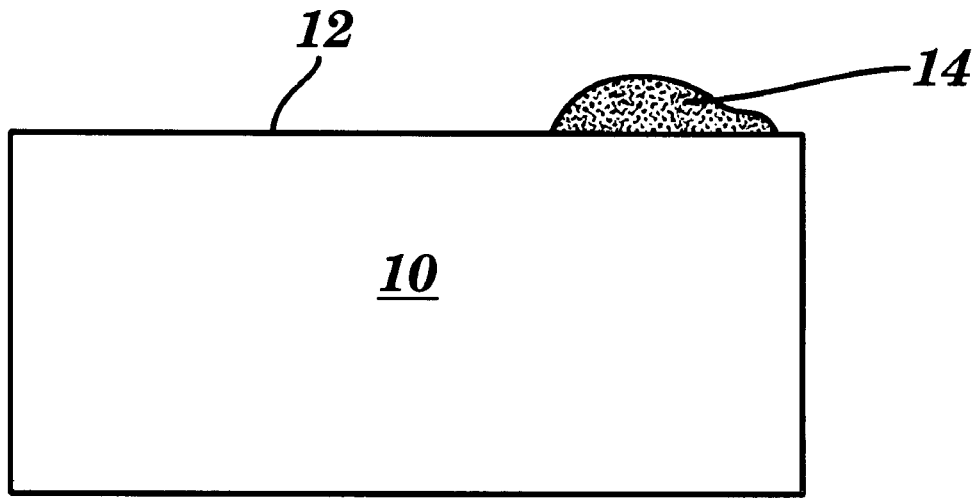
FIG. 1 depicts a side cross-sectional view of an oxide of titanium on the top surface of a layer of material, in accordance with a preferred embodiment of the present invention.

In a first step of a preferred embodiment of the present invention, FIG. 1 illustrates a side cross-sectional view of a layer of material 10 having a top surface 12, and a patch of an oxide of titanium 14, on the top surface 12. The patch of oxide of titanium 14 may include titanium dioxide, titanium oxide, etc. The layer of material 10 may be any material that does not chemically react with the reagent to be discussed in connection with FIG. 2. More particularly, the layer of material 10 may comprise cobalt disilicide ($CoSi_2$) such as is formed in the fabrication of semiconductor devices.

Figure 2:
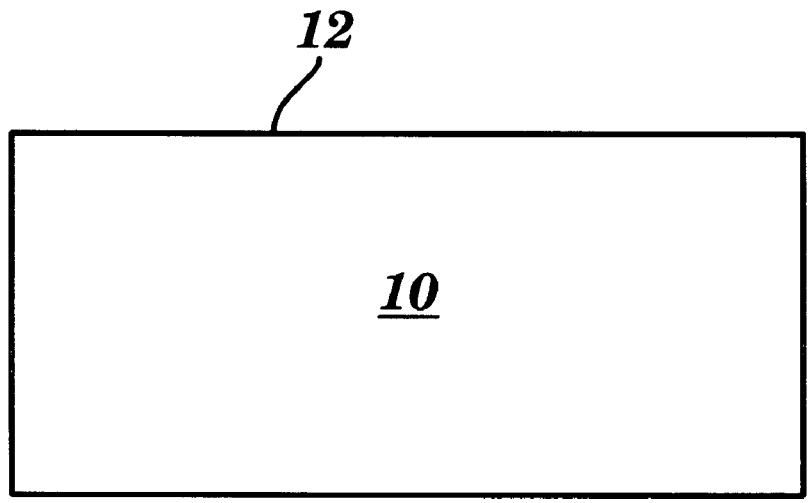
FIG. 2 depicts FIG. 1 with the oxide of titanium removed.

FIG. 2 depicts FIG. 1 with the oxide of titanium removed as a result of applying a reagent under suitable conditions; e.g., by immersing the layer 10 with patch 14 in a chemical reagent at a suitable temperature and period of time, wherein the reagent does not react with the layer of material 10. A particular reagent that is effective for this removal step comprises water ($H_2O$), ammonium hydroxide ($NH_4OH$), and hydrogen peroxide ($H_2O_2$), wherein the $NH_4OH$ and the $H_2O_2$ each comprise approximately 4% of the total reagent volume. This reagent should be applied at a temperature that is approximately in the 45 to 95° C. range for a period of time ranging approximately from 30 seconds to 10 minutes. For example, given a temperature of 65° C., a period of time of approximately 3 minutes is effective. Generally, the minimum required period of time is inversely dependent on the applied temperature.

Figure 3:
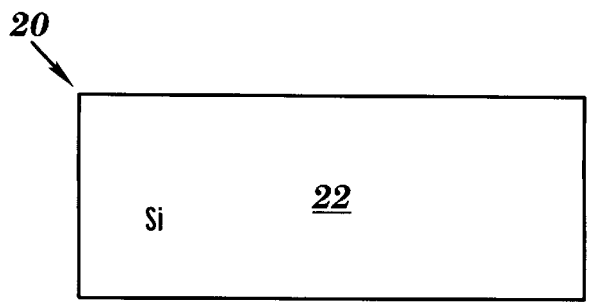
FIG. 3 depicts a side cross-sectional view of a layer of substrate comprising a layer of silicon, in accordance with a preferred embodiment of the present invention.

In a first step of a preferred embodiment of the present invention for forming a clean layer of cobalt disilicide, FIG. 3 illustrates a side cross-sectional view of a provided substrate 20 comprising a layer of silicon 22. A precleaning with a chemical solution, such as hydrofluoric acid (HF), is typically performed prior to the first step of FIG. 3 in order to remove from the layer of, silicon 22 a film of silicon dioxide ($SiO_2$) that results from prior processing or from exposure of silicon to air at room temperature. The film of silicon dioxide has a thickness typically in the range of 20 to 50 angstroms.

Figure 4:
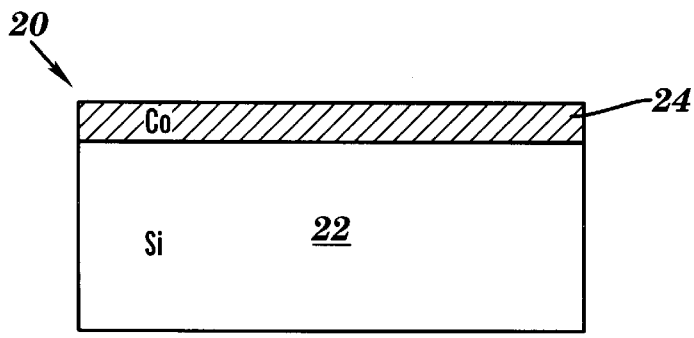
FIG. 4 depicts FIG. 3 with an added layer of cobalt.

FIG. 4 depicts FIG. 3 with an added layer of cobalt 24. The layer of cobalt 24 may be formed on the layer of silicon 22 by any suitable technique known to those skilled in the art. For example, a cobalt sputtering process may be employed, wherein the substrate 20 is placed in a depressurized chamber containing argon (Ar) gas and a region of cobalt. A voltage applied to the chamber first causes the argon atoms to be ionized into Ar+ ions and next accelerates the Ar+ ions to move within the chamber. A percentage of the accelerated Ar+ ions strikes the region of cobalt, resulting in formation of gaseous cobalt with moving cobalt atoms, wherein a share of the moving cobalt atoms adheres to the layer of silicon 22 to form the layer of cobalt 24, as shown in FIG. 4. While a range of thicknesses may characterize the layer of cobalt 24, as is known to those of ordinary skill in the art, a thickness of approximately 80 angstroms is representative. The layer of cobalt 24 should be formed within approximately 2 hours after the precleaning removal of the silicon dioxide film (see discussion of FIG. 3) in order to avoid reforming a silicon dioxide film on the layer of silicon 22.

Figure 5:
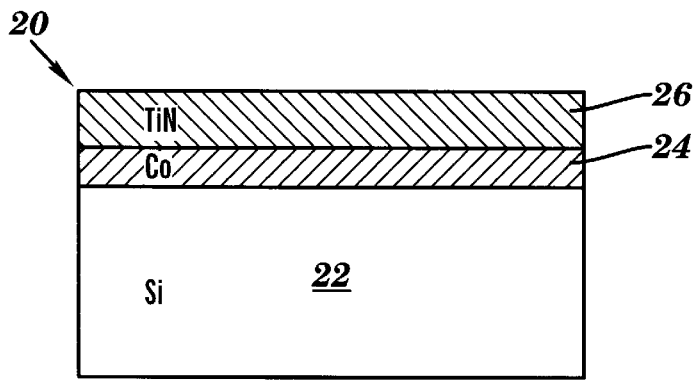
FIG. 5 depicts FIG. 4 with an added layer of titanium nitride.

FIG. 5 depicts FIG. 4 with an added layer of titanium nitride 26. The layer of titanium nitride 26 may be formed on the layer of cobalt 24 by any suitable technique known to those skilled in the art. For example, a sputtering process may be employed, wherein the substrate 20 is placed in a depressurized chamber containing argon (Ar) gas, nitrogen gas, and a region of titanium. A voltage is applied to the chamber, which first causes the argon atoms to be ionized into Ar+ ions and next accelerates the Ar+ ions to move within the chamber. A percentage of the accelerated Ar+ ions strikes the region of titanium resulting in formation of gaseous titanium with moving titanium particles, wherein a share of the moving titanium particles strikes and combines with the nitrogen gas to form titanium nitride particles, and wherein a share of the titanium nitride particles adheres to the layer of cobalt 24 to form the layer of titanium nitride 26, as shown in FIG. 5. While a range of thicknesses may characterize the layer of titanium nitride 26, as is known to those of ordinary skill in the art, a thickness of approximately 200 angstroms is representative.

Figure 6:
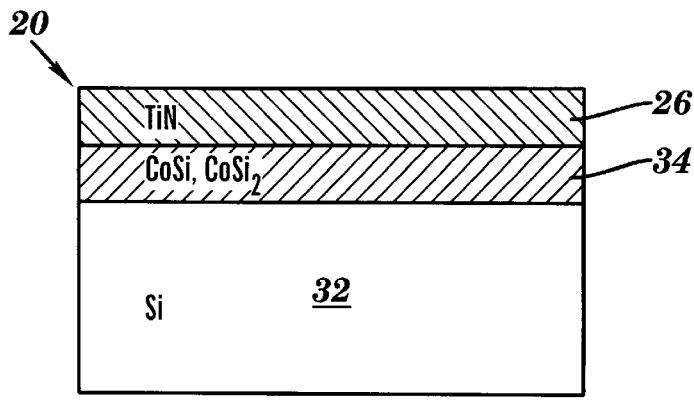
FIG. 6 depicts FIG. 5 following a first annealing step.

FIG. 6 depicts FIG. 5 following a first annealing step, wherein the layer of cobalt 24 and a top portion of the layer of silicon 22 (see FIG. 5) react and are transformed into a layer of silicides or cobalt 34 and a thinner layer of silicon 32 (see FIG. 6), and wherein the layer of silicides of cobalt 34 comprises a greater amount of cobalt monosilicide (CoSi) and a lesser amount of cobalt disilicide ($CoSi_2$). The mixture of cobalt monosilicide and cobalt disilicide is generally inhomogeneously distributed within the layer of silicides of cobalt 34. While the time and temperature of the first annealing step may vary within limits known to those ordinarily skilled in the art, a temperature range of approximately 540° C. to approximately 600° C. for a time period of approximately 5 seconds to approximately 2 minutes are representative. The preceding first annealing step causes the combined thickness of the layer of silicides of cobalt 34 and the thinner layer of silicon 32 (see FIG. 6) to be less than the combined thickness of the layer of cobalt 24 and the layer of silicon 22 (see FIG. 5). While a range of thicknesses may characterize the layer of silicides of cobalt 34, as is known to those ordinarily skilled in the art, a thickness of approximately 160 angstroms is representative.

Figure 7:
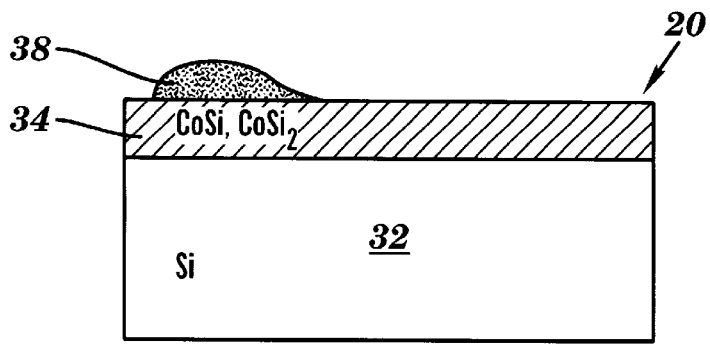
FIG. 7 depicts FIG. 6 following a first cleaning step.

FIG. 7 depicts FIG. 6 following a first cleaning step, which has the purpose of removing the reconfigured layer of titanium nitride 36 (see FIG. 6) and also to remove any unreacted cobalt from the preceding first annealing step. The first cleaning step may be accomplished by use of a chemical reagent, such as one comprising hydrogen peroxide and sulfuric acid. As shown in FIG. 7, an impurity 38 comprising titanium, cobalt, and/or silicon, may be present on the layer of suicides of cobalt 34 after the first cleaning step.

Figure 8:
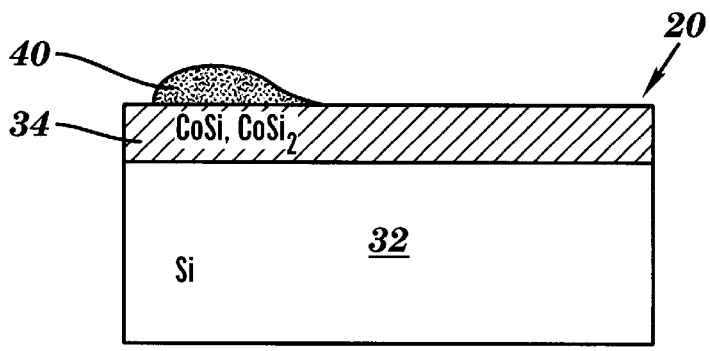
FIG. 8 depicts FIG. 7 following a second cleaning step.

FIG. 8 depicts FIG. 7 following a second cleaning step, whose purpose is to remove the impurity 38 (see FIG. 7). The second cleaning step may be accomplished in the following two sub-steps. First, the substrate 20 is sprayed with a first reagent at a temperature of approximately 40° C., wherein the first reagent comprises water, ammonium hydroxide, and hydrogen peroxide, wherein the ammonium hydroxide and the hydrogen peroxide each comprises approximately 4% of a total first reagent volume. Second, the substrate 20 is sprayed with a second reagent at a temperature of approximately 65° C., wherein the second reagent comprises water, hydrochloric acid, and hydrogen peroxide, wherein the hydrochloric acid comprises approximately 5% of a total second reagent volume, and wherein the hydrogen peroxide comprises approximately 4% of the total second reagent volume. The second cleaning step may not successfully remove all impurities and an impurity 40 comprising titanium may be present on the layer of silicides of cobalt 34 after the second cleaning step, as shown in FIG. 8.

Figure 9:
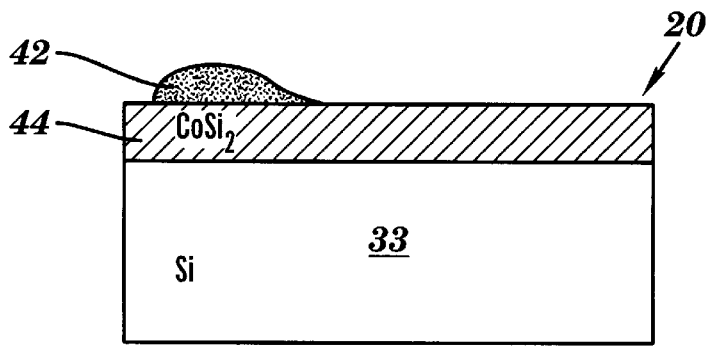
FIG. 9 depicts FIG. 8 following a second annealing step.

FIG. 9 depicts FIG. 8 following a second annealing step, wherein the cobalt silicide in the layer of silicides of cobalt 34 is transformed into cobalt disilicide, resulting in the layer of silicides of cobalt 34 (FIG. 8) being replaced by a layer of cobalt disilicide 44, as shown in FIG. 9. Since the second annealing step involves chemical reactions involving silicon, part of the layer of silicon 32 (FIG. 8) is incorporated within the layer of cobalt disilicide 44 (FIG. 9), which reflects a possible change in the thickness of the layer of silicon 32 (FIG. 8) to form a modified layer of silicon 33 (FIG. 9). While the time and temperature of the second annealing step may vary within limits known to those ordinarily skilled in the art, a temperature range of approximately 700° C. to approximately 850° C. for a time period of approximately 1 second to approximately 1 minute are representative. Generally, the minimum required period of time is inversely dependent on the temperature. Although the second annealing step forms the desired layer of cobalt disilicide 44, an undesired stringer of an oxide of titanium 42 may be nonetheless be present on the layer of the cobalt disilicide 44 following completion of the second annealing step, as shown in FIG. 9.

Figure 10:
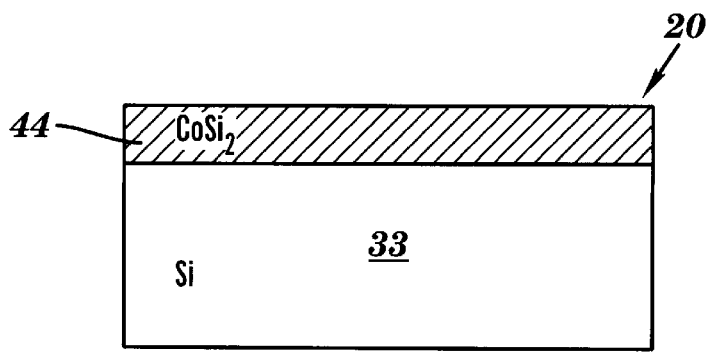
FIG. 10 depicts FIG. 9 following a third cleaning step.

FIG. 10 depicts FIG. 9 following a third cleaning step, which has the purpose of removing the stringer of an oxide of titanium 42 (see FIG. 9) in order to prevent shorting of adjacent electrical structures within, or coupled to, the substrate 20. The third cleaning step removes the stringer 42 by applying a reagent under suitable conditions; e.g., by immersing the substrate 20 in a chemical reagent at a suitable temperature and period of time, wherein the reagent does not chemically react with the layer of cobalt disilicide 42. A particular reagent that is effective for this removal step comprises water ($H_2O$), ammonium hydroxide ($NH_4OH$), and hydrogen peroxide ($H_2O_2$), wherein the $NH_4OH$ and the $H_2O_2$ each comprises approximately 4% of the total reagent volume. This reagent should be applied at a temperature that is approximately in the 45 to 95° C. range for a period of time ranging approximately from 30 seconds to 10 minutes. For example, given a temperature of 65° C., a period of time of approximately 3 minutes is effective. Generally, the minimum required period of time is inversely dependent on the applied temperature. The temperature at which the reagent is applied may be a predetermined temperature, and the period of time may be a predetermined period of time. The effect of the third cleaning step is to achieve the goal of removing the stringer of an oxide of titanium 42, as shown in FIG. 10. achieve the goal of removing the stringer of an oxide of titanium 42, as shown in FIG. 10.

Figure 11:
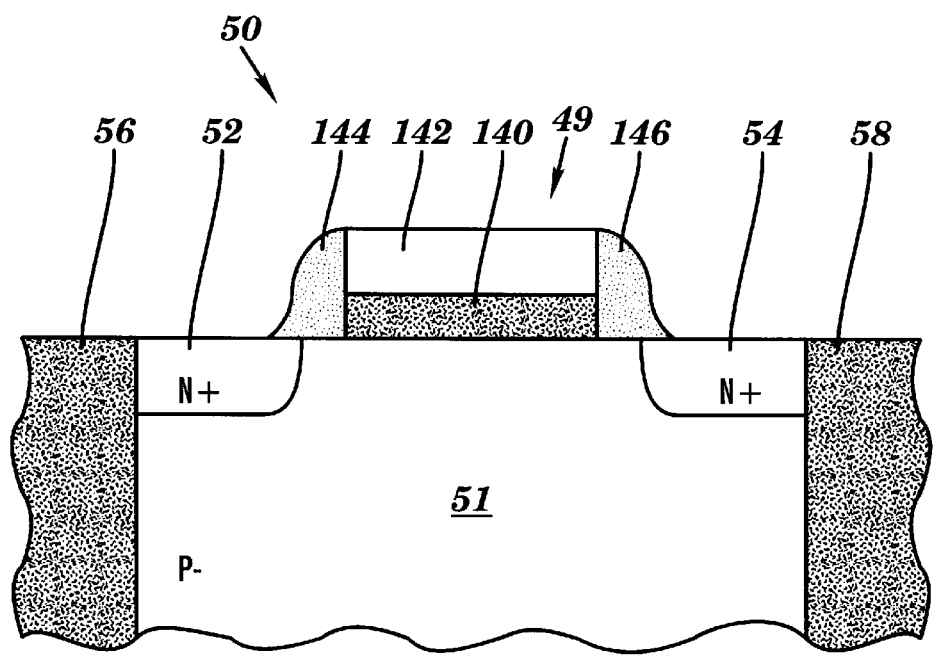
FIG. 11 depicts a side cross-sectional view of a substrate comprising an FET, in accordance with a preferred embodiment of the present invention.

In a first step of a preferred embodiment of the present invention for forming a clean layer of cobalt disilicide, FIG. 11 illustrates a side cross-sectional view of a provided substrate 50, comprising an insulated-gate field effect transistor (FET) 49 and isolating structures 56 and 58. The FET 49 comprises a source 52, drain 54, channel 51, gate 142, gate insulator 140, and insulating spacers 144 and 146. While the source 52, drain 54, and channel 51 are shown to comprise N+, N+, and P− material, respectively, the source 52, drain 54, and channel 51 may alternatively comprise P+, P+, and N− material, respectively. The insulating spacers 144 and 146 comprise any suitable electrically insulating material such as an oxide or nitride of silicon. The isolating structures 56 and 58 are any structures that electrically isolate the FET 49 such as trench isolation structures or grown oxide structures.

A precleaning of the substrate 50 with a chemical solution, such as hydrofluoric acid (HF), is typically performed prior to the first step of FIG. 11 in order to remove from a surface of the substrate 50 a film of silicon dioxide ($SiO_2$) that results from exposure of silicon to air at room temperature. The film of silicon dioxide has a thickness typically in the range of 20 to 50 angstroms.

Figure 12:
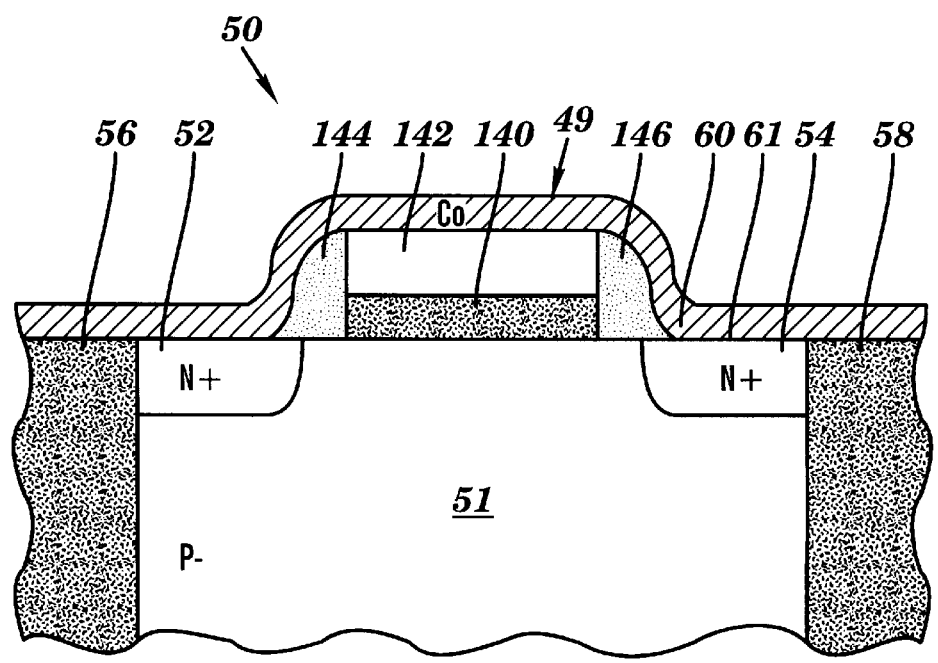
FIG. 12 depicts FIG. 11 with an added layer of cobalt.

FIG. 12 depicts FIG. 11 with an added layer of cobalt 60. The layer of cobalt 60 may be formed on a top surface 61 of the FET 49 and isolating structures 56 and 58 by any suitable technique known to those skilled in the art. For example, a cobalt sputtering process may be employed, wherein the substrate 50 is placed in a depressurized chamber containing argon (Ar) gas and a region of cobalt. A voltage applied to the chamber first causes the argon atoms to be ionized into Ar+ ions and next accelerates the Ar+ ions to move within the chamber. A percentage of the accelerated Ar+ ions strikes the region of cobalt, resulting in formation of gaseous cobalt with moving cobalt particles, wherein a share of the moving cobalt particles adheres to the top surface 61 to form the layer of cobalt 60, as shown in FIG. 12. While a range of thicknesses may characterize the layer of cobalt 60, as is known to those of ordinary skill in the art, a thickness of approximately 80 angstroms is representative. The layer of cobalt 60 should be formed within approximately 2 hours after the precleaning removal of the silicon dioxide film (see discussion of FIG. 11) in order to avoid reforming a silicon dioxide film on the top surface 61.

Figure 13:
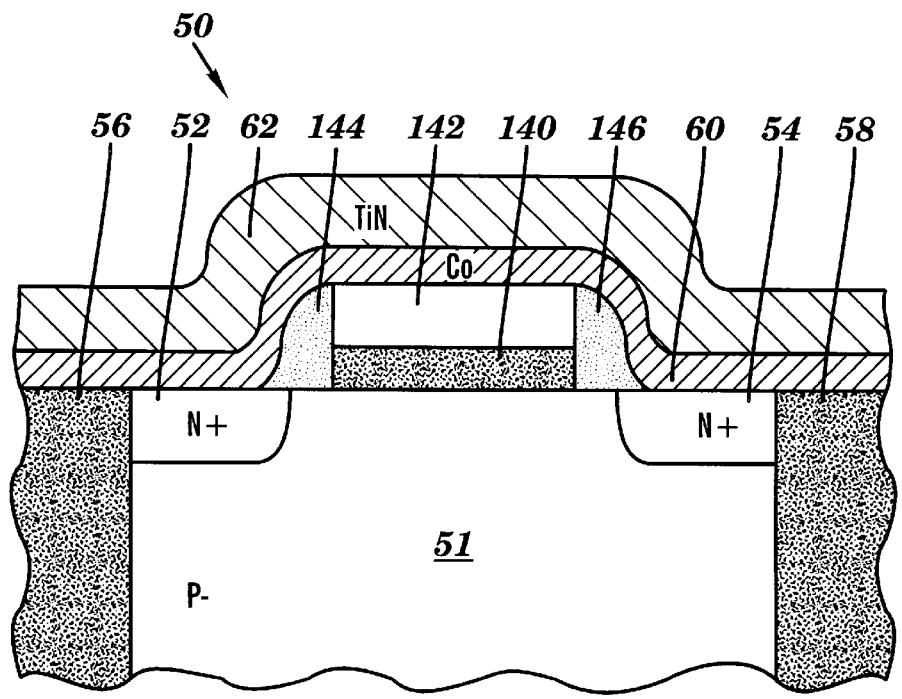
FIG. 13 depicts FIG. 12 with an added layer of titanium nitride.

FIG. 13 depicts FIG. 12 with an added layer of titanium nitride 62. The layer of titanium nitride 62 may be formed on the layer of cobalt 60 by any suitable technique known to those ordinarily skilled in the art. For example, a sputtering process may be employed, wherein the substrate 50 is placed in a depressurized chamber containing argon (Ar) gas, nitrogen gas, and a region of titanium. A voltage is applied to the chamber, which first causes the argon atoms to be ionized into Ar+ ions and next accelerates the Ar+ ions to move within the chamber. A percentage of the accelerated Ar+ ions strikes the region of titanium resulting in formation of gaseous titanium with moving titanium particles, wherein a share of the moving titanium particles strikes and combines with the nitrogen gas to form titanium nitride particles, and wherein a share of the titanium nitride particles adheres to the layer of cobalt 60 to form the layer of titanium nitride 62, as shown in FIG. 13. While a range of thicknesses may characterize the layer of titanium nitride 62, as is known to those of ordinary skill in the art, a thickness of approximately 200 angstroms is representative.

Figure 14:
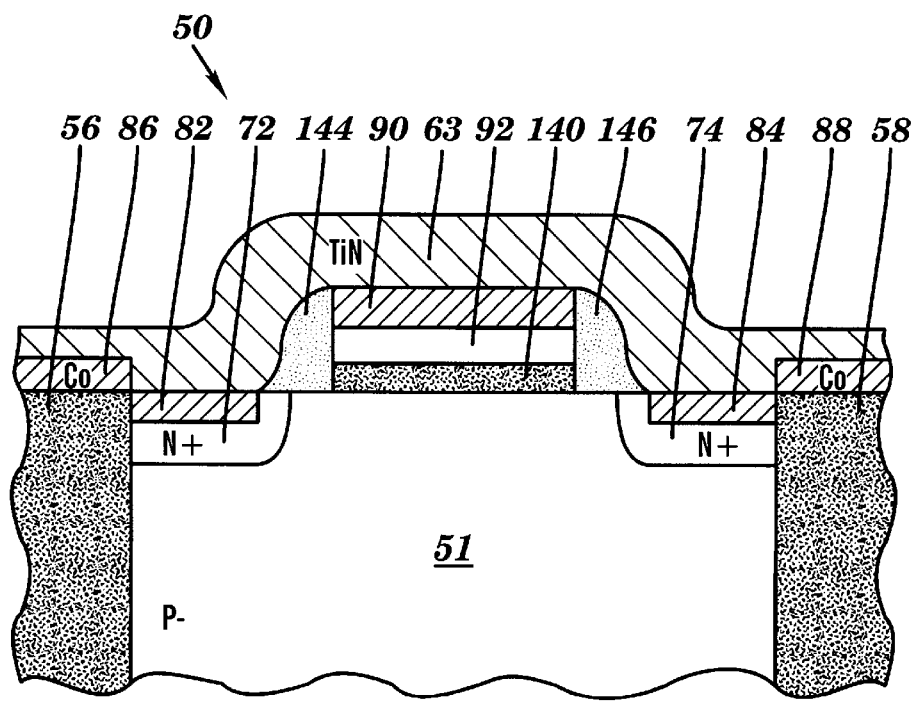
FIG. 14 depicts FIG. 13 following a first annealing step.

FIG. 14 depicts FIG. 13 following a first annealing step, wherein the layer of cobalt 60 reacts with at top portion of the source 52, drain 54, and gate 142 (see FIG. 13) to form layers of silicides of cobalt 82, 84, and 90, respectively (see FIG. 14), comprising a greater amount of cobalt silicide (CoSi) and a lesser amount of cobalt disilicide ($CoSi_2$). The mixture of cobalt silicide and cobalt disilicide is generally inhomogeneously distributed within the layers of silicides of cobalt 82, 84, and 90. Also, the source 52, drain 54, and gate 142 (see FIG. 13) are geometrically transformed into source 72, drain 74, and gate 92, respectively (see FIG. 14). Non-reacting cobalt remain in cobalt layers 86 and 88. The first annealing step also reconfigures the layer of titanium nitride 62 (see FIG. 13), into the layer of titanium nitride 63 (see FIG. 14). While the time and temperature of the first annealing step may vary within limits known to those ordinarily skilled in the art, a temperature range of approximately 540° C. to approximately 600° C. for a time period of approximately 5 seconds to approximately 2 minutes are representative. While a range of thicknesses may characterize the layers of silicides of cobalt 82, 84, and 90, as is known to those of ordinary skill in the art, a thickness of approximately 160 angstroms is representative.

Figure 15:
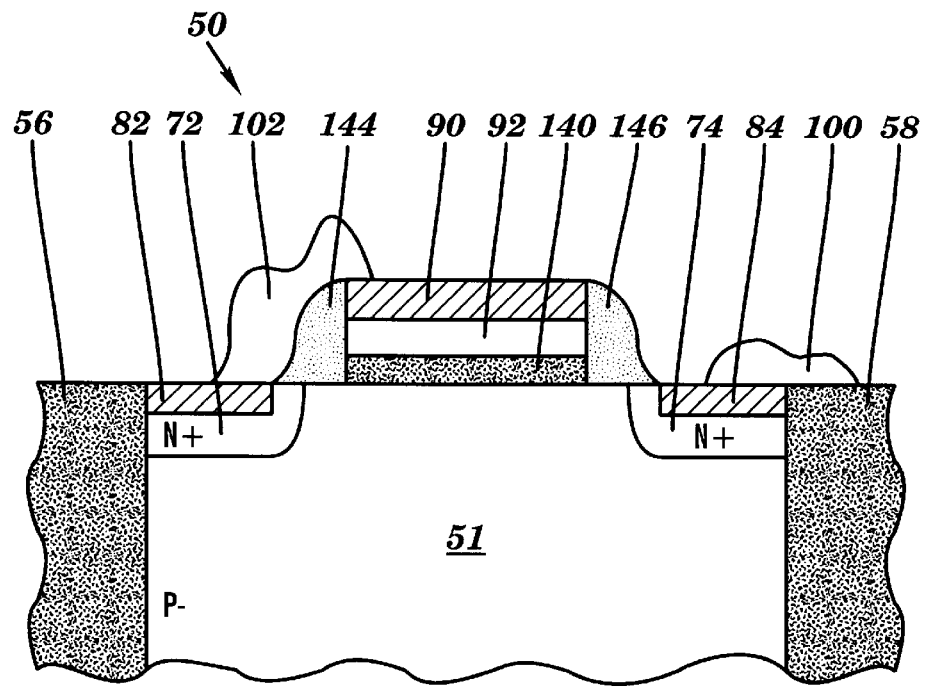
FIG. 15 depicts FIG. 14 following a first cleaning step.

FIG. 15 depicts FIG. 14 following a first cleaning step, whose purpose is to remove the layer of titanium nitride 63 (see FIG. 14) and also to remove cobalt layers 86 and 88 as well as any additional unreacted cobalt from the preceding first annealing step. The first cleaning step may be accomplished by use of a chemical reagent, such as one comprising hydrogen peroxide and sulfuric acid. As shown in FIG. 15, impurities 100 and 102, comprising titanium, cobalt, and/or silicon, may be present after the first cleaning step.

Figure 16:
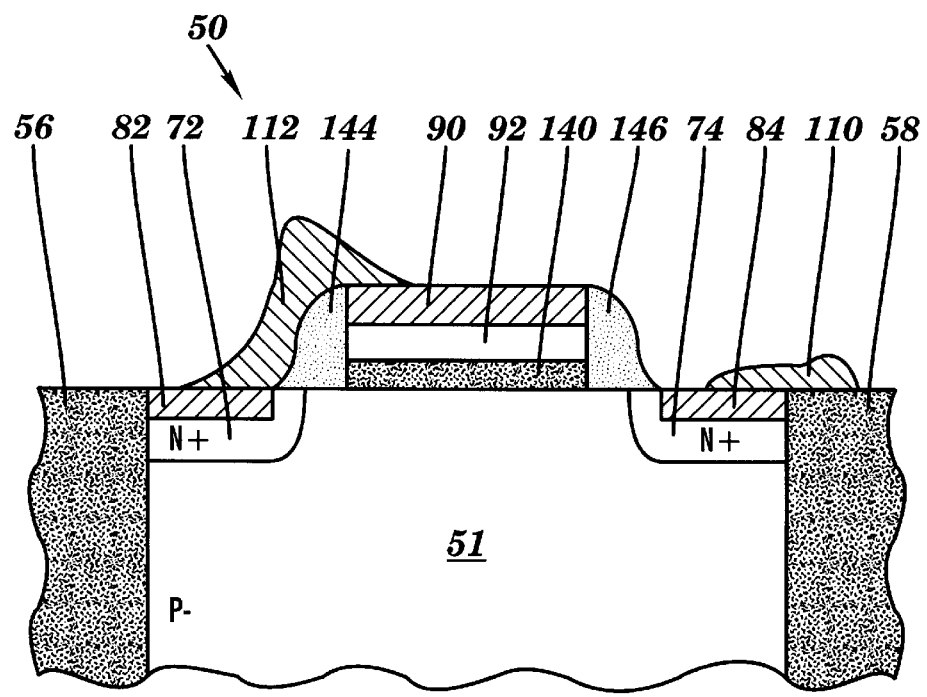
FIG. 16 depicts FIG. 15 following a second cleaning step.

FIG. 16 depicts FIG. 15 following a second cleaning step, which has the purpose of removing the impurities 100 and 102 (see FIG. 15). The second cleaning step may be accomplished in the following two sub-steps. First, the substrate 50 is sprayed with a first reagent at a temperature of approximately 40° C., wherein the first reagent comprises water, ammonium hydroxide, and hydrogen peroxide, wherein the ammonium hydroxide and the hydrogen peroxide each comprises approximately 4% of a total first reagent volume. Second, the substrate 50 is sprayed with a second reagent at a temperature of approximately 65° C., wherein the second reagent comprises water, hydrochloric acid, and hydrogen peroxide, wherein the hydrochloric acid comprises approximately 5% of a total second reagent volume, and wherein the hydrogen peroxide comprises approximately 4% of the total second reagent volume. The second cleaning step may not successfully remove all impurities and the impurities 110 and 112 comprising titanium may be present after the second cleaning step, as shown in FIG. 16.

Figure 17:
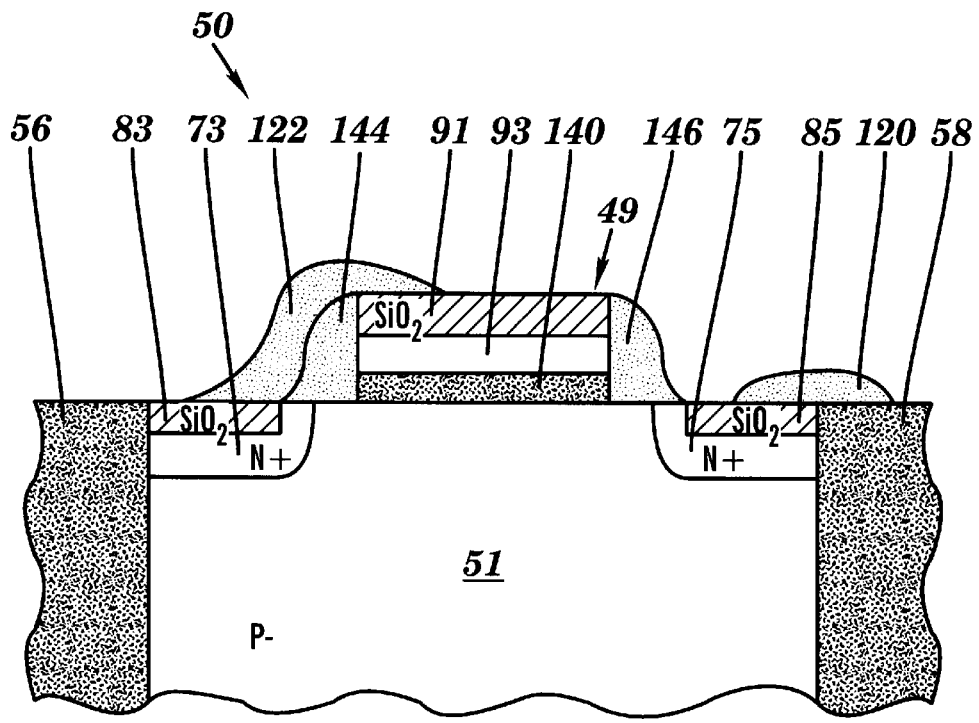
FIG. 17 depicts FIG. 16 following a second annealing step.

FIG. 17 depicts FIG. 16 following a second annealing step, wherein the cobalt silicide in the layers of silicides of cobalt 82, 84, and 90 is transformed into cobalt disilicide, resulting in the layers of silicides of cobalt 82, 84, and 90 (FIG. 16) being replaced by a layers of cobalt disilicide 83, 85, and 91, respectively (FIG. 17). Since the second annealing step relates to chemical reactions involving silicon, the source 72, drain 74, and gate 92 (FIG. 16) are geometrically changed into source 73, drain 75, and gate 93, respectively (FIG. 17). Gate 92 (FIG. 16) is changed to gate 93 (FIG. 17), which reflects a possible repositioning of gate 92. While the time and temperature of the second annealing step may vary within limits known to those ordinarily skilled in the art, a temperature range of approximately 700° C. to approximately 850° C. for a time period of approximately 1 second to approximately 1 minute are representative. Generally, the minimum required period of time is inversely dependent on the temperature. Although the second annealing step forms the desired layers of cobalt disilicide 83, 85, and 91, undesired stringers of an oxide of titanium 120 and 122 may be nonetheless be present following completion of the second annealing step, as shown in FIG. 17.

Figure 18:
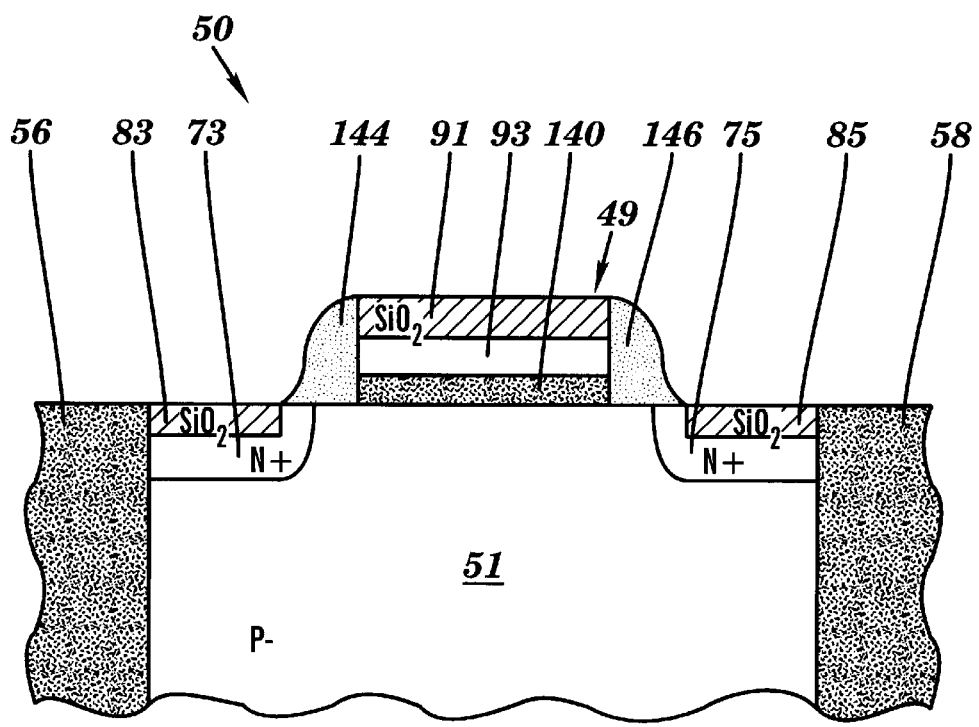
FIG. 18 depicts FIG. 17 following a third cleaning step.

FIG. 18 depicts FIG. 17 following a third cleaning step, which ha the purpose of removing the stringers of an oxide of titanium 120 and 122 (see FIG. 17) in order to prevent shorting of adjacent electrical structures within, or coupled to, the FET 49. The third cleaning step removes the stringers 120 and 122 by applying a reagent under suitable conditions; e.g., by immersing the substrate 50 in a chemical reagent at a suitable temperature and period of time, wherein the reagent does not chemically react with the layers of cobalt disilicide 83, 85, and 91. A particular reagent that is effective for this removal step comprises water ($H_2O$), ammonium hydroxide ($NH_4OH$), and hydrogen peroxide ($H_2O_2$), wherein the $NH_4OH$ and the $H_2O_2$ each comprises approximately 4% of the total reagent volume. This reagent should be applied at a temperature that is approximately in the 45 to 95° C. range for a period of time ranging approximately from 30 seconds to 10 minutes. For example, given a temperature of 65° C., a period of time of approximately 3 minutes is effective. Generally, the minimum required period of time is inversely dependent on the applied temperature. The effect of the third cleaning step is to achieve the goal of removing the stringers 120 and 122, as shown in FIG. 18.

While preferred and particular embodiments of the present invention have been described herein for purposes of illustration, many modifications and changes will become apparent to those ordinarily skilled in the art. Accordingly, the appended claims are intended to encompass all such modifications and changes as fall within the true spirit and scope of this invention.

We claim:

1. A method for removing a patch comprising an oxide of titanium from a layer comprising cobalt disilicide, comprising the step of:

removing the patch by applying a reagent to the patch at a temperature and for a time, wherein the reagent does not chemically react with the layer, and wherein the reagent comprises water, ammonium hydroxide, and hydrogen peroxide.

2. The method of claim 1, wherein for the removing step:

the ammonium hydroxide comprises approximately 4 percent of a total reagent volume of the reagent, the hydrogen peroxide comprises approximately 4 percent of the total reagent volume, the temperature is approximately between 45 degrees celsius and 95 degrees celsius, and the time is approximately between 30 seconds and 10 minutes.

3. A method for forming an electrical structure comprising a layer of cobalt disilicide, comprising the steps of:

providing a substrate comprising a layer of silicon;

forming a layer of cobalt on the layer of silicon;

forming a layer of titanium nitride on the layer of cobalt;

executing a first annealing of the substrate to react the layer of cobalt with an upper portion of the layer of silicon to form a layer of silicides of cobalt between the layer of titanium nitride and a remaining layer of silicon, and wherein the layer of silicides comprises cobalt silicide and cobalt disilicide;

conducting a first cleaning of the substrate to remove the layer of titanium nitride, wherein an impurity is left on the layer of silicides of cobalt;

conducting a second cleaning of the substrate to remove the impurity;

performing a second annealing of the substrate at an annealing temperature, and for an annealing time, sufficient to transform the layer of silicides of cobalt into the layer of cobalt disilicide, wherein a stringer comprising an oxide of titanium is left on the layer of cobalt disilicide; and conducting a third cleaning of the substrate to remove the stringer by applying a reagent to the substrate at a temperature and for a time, wherein the reagent does not chemically react with the layer of cobalt disilicide, and wherein the reagent comprises water, ammonium hydroxide, and hydrogen peroxide.

4. The method of claim 3, wherein for the step of conducting a third cleaning:

the ammonium hydroxide comprises approximately 4 percent of a total volume of the reagent, the hydrogen peroxide comprises approximately 4 percent of the total volume of the reagent, the temperature is approximately between 45 degrees celsius and 95 degrees celsius, and the time is approximately between 30 seconds and 10 minutes.

5. The method of claim 3, wherein the substrate in the providing step comprises a film of silicon dioxide on the layer of silicon, and wherein a step of removing the film of silicon dioxide is performed prior to the step of providing a substrate.

6. The method of claim 3, wherein the step of conducting a first cleaning of the substrate comprises immersing the substrate in a mixture of hydrogen peroxide and sulfuric acid.

7. The method of claim 3, wherein the impurity in the step of conducting a first cleaning is from the group consisting of a titanium compound, a cobalt compound, and a silicon compound.

8. The method of claim 3, wherein the step of conducting a second cleaning of the substrate comprises the steps of:

applying a first reagent to the substrate at a temperature of approximately 40 degrees celsius, wherein the first reagent comprises water, ammonium hydroxide, and hydrogen peroxide, wherein the ammonium hydroxide comprises approximately 4 percent of a total volume of the first reagent, and wherein the hydrogen peroxide comprises approximately 4 percent of the total volume of the first reagent; and applying a second reagent to the substrate at a temperature of approximately 65 degrees celsius, wherein the second reagent comprises water, hydrochloric acid, and hydrogen peroxide, wherein the hydrochloric acid comprises approximately 5 percent of a total volume of the second reagent, and wherein the hydrogen peroxide comprises approximately 4 percent of the total volume of the second reagent.

9. A method for forming cobalt disilicide within an FET, wherein the FET is an insulated-gate field effect transistor, comprising the steps of:

providing a substrate comprising the FET, a left insulating structure bordering a left side of the FET, a right insulating structure bordering a right side of the FET, and a top surface, wherein the FET comprises a source, a drain, and a gate, and wherein the top surface comprises a top surface of the FET, a top surface of the left insulating structure, and a top surface of the right-insulating structure;

forming a layer of cobalt on the top surface;

forming a layer of titanium nitride on the layer of cobalt;

performing a first annealing of the substrate to react a portion of the layer of cobalt with the source, the gate, and the drain, wherein a top portion of the source is converted into a first silicide region comprising cobalt silicide and cobalt disilicide, wherein a top portion of the gate is converted into a second silicide region comprising cobalt silicide and cobalt disilicide, wherein a top portion of the drain is converted into a third silicide region comprising cobalt silicide and cobalt disilicide, and wherein unreacted cobalt remains;

conducting a first cleaning of the substrate to remove the layer of titanium nitride and the unreacted cobalt, wherein an impurity is left on the FET;

conducting a second cleaning of the substrate to remove the impurity;

performing a second annealing of the substrate at an annealing temperature and for an annealing time sufficient to effectuate a cobalt silicide to cobalt disilicide reaction within a silicide zone, wherein the silicide zone comprises the first silicide region, the second silicide region, and the third silicide region, and wherein a stringer comprising an oxide of titanium contacts the silicide zone; and conducting a third cleaning of the substrate to remove the stringer by applying a reagent to the substrate at a temperature and for a time, wherein the reagent does not chemically react with the cobalt disilicide zone, and wherein the reagent comprises water, ammonium hydroxide, and hydrogen peroxide.

10. The method of claim 9, wherein for the step of conducting a third cleaning:

the ammonium hydroxide comprises approximately 4 percent of a total volume of the reagent, the hydrogen peroxide comprises approximately 4 percent of the total volume of the reagent, the temperature is approximately between 45 degrees celsius and 95 degrees celsius, and the time is approximately between 30 seconds and 10 minute.

11. The method of claim 9, wherein the substrate in the providing step comprises a film of silicon dioxide on a portion of the top surface, and wherein a step of removing the film of silicon dioxide is performed prior to the step providing a substrate.

12. The method of claim 9, wherein the substrate in the providing step comprises a buried oxide layer, wherein the step of forming a layer of cobalt results in the FET being positioned between the buried oxide layer and the layer of cobalt.

13. The method of claim 9, wherein the step of conducting a first cleaning of the substrate comprises immersing the substrate in a mixture of hydrogen peroxide and sulfuric acid.

14. The method of claim 9, wherein the impurity in the step of conducting a first cleaning is from the group consisting of a titanium compound, a cobalt compound, and a silicon compound.

15. The method of claim 9, wherein the step of conducting a second cleaning of the substrate comprises the steps of:

applying a first reagent to the substrate at a first temperature of approximately 40 degrees celsius, wherein the first reagent comprises water, ammonium hydroxide, and hydrogen peroxide, wherein the ammonium hydroxide comprises approximately 4 percent of a total volume of the first reagent, and wherein the hydrogen peroxide comprises approximately 4 percent of the total volume of the first reagent; and applying a second reagent to the substrate at a second temperature of approximately 65 degrees celsius, wherein the second reagent comprises water, hydrochloric acid, and hydrogen peroxide, wherein the hydrochloric acid comprises approximately 5 percent of a total volume of the second reagent, and wherein the hydrogen peroxide comprises approximately 4 percent of the total volume of the second reagent.

16. The method of claim 9, wherein the left insulating structure in the providing step comprises a trench isolation structure.

17. The method of claim 9, wherein the left insulating structure in the providing step comprises a grown oxide of silicon.

18. The method of claim 9, wherein a left insulating spacer borders a left side of the gate and a portion of a top side of the source, and wherein a right insulating spacer borders a right side of the gate and a portion of a top side of the drain.

19. The method of claim 9, wherein the step of forming a layer of cobalt is accomplished by a first sputtering process comprising:

placing the substrate into a depressurized chamber, wherein the chamber comprises argon gas and a region of cobalt;

energizing the argon gas to form and accelerate argon ions, wherein a percentage of the accelerated argon ions strikes the region of cobalt to generate moving cobalt particles, and wherein a share of the moving cobalt particles adheres to the layer of silicon to form the layer of cobalt.

20. The method of claim 9, wherein the step of forming a layer of titanium nitride is accomplished by a second sputtering process comprising:

placing the substrate into a depressurized chamber, wherein the chamber comprises argon gas, nitrogen gas, and a region of titanium;

energizing the argon gas to form and accelerate argon ions, wherein a percentage of the accelerated argon ions strikes the region of titanium to generate moving titanium particles, and wherein a portion of the moving titanium particles strikes and combines with the nitrogen gas to form titanium nitride particles, and wherein a share of the titanium nitride particles contacts the layer of cobalt to form the layer of titanium nitride.

21. The method of claim 9, wherein the step of performing the first annealing is executed at a first annealing temperature of approximately 575 degrees celsius for a first annealing time of approximately 80 seconds.

22. The method of claim 9, wherein the step of performing the second annealing is executed at the annealing temperature of approximately 750 degrees celsius for the annealing time of approximately 30 seconds.

23. The method of claim 9, wherein the source and the drain in the providing step each comprise N-doped silicon.

24. The method of claim 9, wherein the source and the drain in the providing step each comprise P-doped silicon.

* * * * *